(12) United States Patent
Yoo et al.

(10) Patent No.: US 7,956,538 B2
(45) Date of Patent: Jun. 7, 2011

(54) ORGANIC LIGHT EMITTING DISPLAY

(75) Inventors: Seung-Joon Yoo, Yongin (KR); Jae-Sun Lee, Yongin (KR); Il-Sang Lee, Yongin (KR); Hye-Sun Kim, Yongin (KR); Hyun-Soo Jung, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 27 days.

(21) Appl. No.: 12/469,596

(22) Filed: May 20, 2009

(65) Prior Publication Data

US 2010/0141136 A1 Jun. 10, 2010

(30) Foreign Application Priority Data

Dec. 10, 2008 (KR) .................. 10-2008-0125380

(51) Int. Cl.
*H05B 33/02* (2006.01)
(52) U.S. Cl. ..................................... 313/512
(58) Field of Classification Search ............ 313/512; 445/24
See application file for complete search history.

(56) References Cited

U.S. PATENT DOCUMENTS

| 5,868,667 | A | * | 2/1999 | Lin et al. .................. 600/133 |
| 2005/0272046 | A1 | * | 12/2005 | Schermer et al. ............ 435/6 |
| 2006/0022592 | A1 | * | 2/2006 | Boroson .................. 313/512 |
| 2007/0096631 | A1 | * | 5/2007 | Sung et al. ............... 313/498 |
| 2007/0159096 | A1 | * | 7/2007 | Oh et al. .................. 313/512 |

FOREIGN PATENT DOCUMENTS

| JP | 2000-100561 | 4/2000 |
| JP | 2004-146381 | 5/2004 |
| KR | 10-2002-0094425 | 12/2002 |

OTHER PUBLICATIONS

English Translation of KR 10-2002-0094425 A.*

* cited by examiner

*Primary Examiner* — Toan Ton
*Assistant Examiner* — Hana S Featherly
(74) *Attorney, Agent, or Firm* — Christie, Parker & Hale, LLP

(57) ABSTRACT

An organic light emitting display includes a substrate; an organic light emitting diode on one surface of the substrate; an encapsulation substrate located opposite and substantially parallel to the substrate with the organic light emitting diode therebetween; a filler layer on one surface of the encapsulation substrate facing the substrate; a first encapsulation layer located between the encapsulation substrate and the substrate and sealing the substrate and the encapsulation substrate together; and a second encapsulation layer located adjacent to the first encapsulation layer and between the encapsulation substrate and the substrate, wherein the filler layer and the second encapsulation layer include a moisture absorbent.

18 Claims, 1 Drawing Sheet

ORGANIC LIGHT EMITTING DISPLAY

CROSS-REFERENCE TO RELATED APPLICATION

This application claims priority to and the benefit of Korean Patent Application No. 10-2008-0125380 filed in the Korean Intellectual Property Office on Dec. 10, 2008, the entire content of which is incorporated herein by reference.

BACKGROUND OF THE INVENTION

1. Field of the Invention

The present invention relates to an organic light emitting display. More particularly, the present invention relates to an organic light emitting display having excellent stability.

2. Description of the Related Art

Recently, display panels using an organic light emitting display are in the spotlight, and semiconductor techniques for manufacturing these displays are rapidly being developed.

Organic light emitting displays generally include a panel assembly with organic light emitting diodes, a bezel connected to the panel assembly at the rear part thereof, and a printed circuit substrate electrically connected to the panel assembly through a flexible printed circuit (FPC).

The panel assembly of the organic light emitting display is formed of two very thin substrates that have an empty space therebetween. In addition, an anode electrode and a cathode electrode are formed on the substrates. The cathode is formed with a material having a low work function, for example a highly reactive alloy including an alkali metal and an alkaline earth metal. The reactive metal oxidizes easily by reacting with oxygen or moisture, resulting in the deterioration of device characteristics or the shortening of device life-span. In addition, an organic material layer formed below the cathode layer is susceptible to rapid deterioration from exposure to oxygen and moisture.

Accordingly, the organic light emitting display has an encapsulation structure in which a glass or metal cap is adhered to the top thereof through interposing a sealant between it and the anode electrode. A moisture absorbent getter is adhered to the bottom part of the cap with adhesive tape, and the getter captures moisture flowing from the outside through the adhesive part to maintain the device in a stable state.

Instead of a metal or glass cap, an organic light emitting display may be encapsulated by two or more organic and/or inorganic layers that are layered together, with a print material fused with a laser, or with an encapsulation layer that is formed by dispersing a moisture absorbent in a polymer. Researches for determining new and better ways to encapsulate organic light emitting displays are ongoing.

SUMMARY OF THE INVENTION

An exemplary embodiment of the present invention provides an organic light emitting display that maintains a sufficient seal to moisture and oxygen to provide excellent stability.

The embodiments of the present invention are not limited to the above technical purpose, and a person of ordinary skill in the art will understand other technical purposes.

According to one embodiment of the present invention, an organic light emitting display is provided. The organic light emitting display includes a substrate, an organic light emitting diode on a side of the substrate, an encapsulation substrate located opposite and substantially parallel to the substrate with the organic light emitting diode therebetween, a filler layer on one surface of the encapsulation substrate facing the substrate, a first encapsulation layer located between the encapsulation substrate and the substrate, and sealing the substrate and the encapsulation substrate together, and a second encapsulation layer located adjacent to the first encapsulation layer and between the encapsulation substrate and the substrate, wherein the filler layer and the second encapsulation layer include a moisture absorbent.

The amount of moisture absorbent included in the filler layer and the second encapsulation layer has the relationship represented by the following Equation 1.

$$B - A > 0 \qquad \text{Formula 1}$$

In Formula 1, B is the amount of moisture absorbent included in the second encapsulation layer, and A is the amount of moisture absorbent included in the filler layer.

According to an embodiment of the present invention, a method of sealing an organic light emitting display is provided. The organic light emitting display includes a substrate having an organic light emitting diode on the substrate and an encapsulation substrate arranged opposite and substantially parallel to the substrate with the organic light emitting diode therebetween. The substrate and the encapsulation substrate are sealed together using a first encapsulation layer located between the encapsulation substrate and the substrate. A filler layer is placed at a side of the encapsulation substrate facing the substrate and a second encapsulation layer located adjacent to the first encapsulation layer and between the encapsulation substrate and the substrate. The filler layer and the second encapsulation layer comprise a moisture absorbent.

Hereinafter, further embodiments of the present invention will be described in detail.

The organic light emitting display according to an embodiment of the present invention maintains a seal to moisture and oxygen, so as to provide excellent stability.

DETAILED DESCRIPTION

Figure 1:
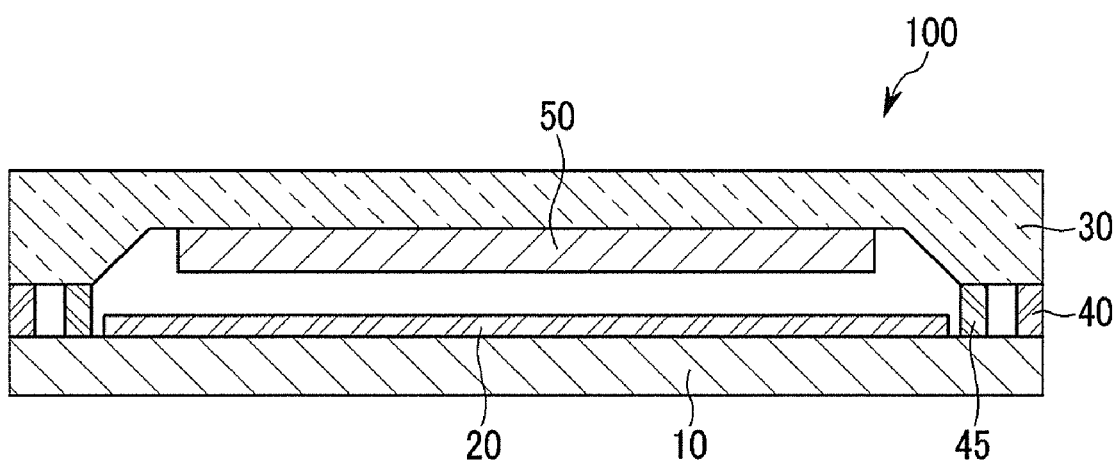
FIG. 1 is a schematic cross-sectional view of an organic light emitting display according to one embodiment of the present invention.

Exemplary embodiments of the present invention will hereinafter be described in detail. However, these embodiments are only exemplary, and the present invention is not limited thereto.

Exemplary embodiments of the present invention relate to an organic light emitting display having excellent stability since it maintains a good seal to moisture and oxygen.

The organic light emitting display according to one embodiment of the present invention includes a substrate and an organic light emitting diode formed on one surface of the substrate. The substrate and the organic light emitting diode are sealed by an encapsulation substrate arranged opposite and substantially parallel to the substrate with the organic light emitting diode therebetween.

In addition, the organic light emitting display according to one embodiment of the present invention includes a filler layer formed on one surface of the encapsulation substrate facing the substrate, a first encapsulation layer disposed between the encapsulation substrate and the substrate and sealing the substrate and the encapsulation substrate together, and a second encapsulation layer disposed between the encapsulation substrate and the substrate and adjacent to the first encapsulation layer.

According to one embodiment of the present invention, the filler layer includes a polymer and a moisture absorbent, and the second encapsulation layer includes a sealant and a moisture absorbent. The first encapsulation layer is formed with a sealant, and may further include a moisture absorbent.

According to one embodiment of the present invention, by including a larger amount of moisture absorbent in the second encapsulation layer, oxygen and moisture are effectively suppressed. In other words, the amount of moisture absorbent included in the filler layer and the second encapsulation layer has a relationship represented by the following Equation 1.

$$B-A>0 \qquad \text{Equation 1}$$

In Equation 1, B is the amount of moisture absorbent included in the second encapsulation layer, and A is the amount of moisture absorbent included in the filler layer.

According to one embodiment, the amount (A) of moisture absorbent included in the filler layer ranges from about 0.1 to 10 wt %, and in another embodiment, it ranges from about 0.1 to 5 wt %. According to one embodiment, the amount (B) of moisture absorbent included in the second encapsulation layer ranges from about 1 to 30 wt %, and in another embodiment, it ranges from about 2 to 10 wt %. The amount of moisture absorbent included in the filler layer and the amount of moisture absorbent included in the second encapsulation layer should be within the wt % ranges and satisfy the relationship represented by Equation 1.

If the first encapsulation layer includes the moisture absorbent, the amount has the relationship represented by the following Equation 2.

$$A-C>0 \qquad \text{Equation 2}$$

In Equation 2, C is the amount of moisture absorbent included in the first encapsulation layer, and A is the amount of moisture absorbent included in the filler layer.

Accordingly, considering the relationships of Equation 1 and Equation 2, the amount of moisture absorbent becomes the largest in the second encapsulation layer and the least in the first encapsulation layer.

According to one embodiment, the amount of moisture absorbent included in the first encapsulation layer ranges from about 0 to 1 wt %, and in another embodiment, it ranges from about 0 to 0.5 wt %. The amount of moisture absorbent included in the first encapsulation layer should be within the wt % ranges and satisfy the relationship represented by Equation 2.

In the organic light emitting display according to one embodiment of the present invention, the first encapsulation layer blocks and/or absorbs moisture such that the transmittance of moisture ranges from about 0.01 to 1 g/m²·day. Moisture or oxygen passing the first encapsulation layer is blocked and/or absorbed by the moisture absorbent of the second encapsulation layer. When it is present in the first encapsulation layer and the second encapsulation layer, the transmittance of moisture may be blocked and/or absorbed within a range of about 0.0001 to 0.1 g/m²·day, and a trace amount of moisture or oxygen passing through the second encapsulation layer may be further blocked and/or absorbed by moisture absorbent of the filler layer, so it is possible to ensure moisture transmittance of about $10^{-3}$ g/m²·day or less. In the other words, the organic light emitting display according to an embodiment of the present invention includes moisture absorbent in the second encapsulation layer and the filler layer to block the moisture to ensure a low moisture transmittance of about $10^{-3}$ g/m²·day or less. Therefore, effective suppression of the deterioration of organic light emitting diodes due to the transmission of moisture or oxygen is achieved. Accordingly, the lifespan of an organic light emitting display of an embodiment of the present invention may be effectively increased.

According to one embodiment, the moisture absorbent is selected from the group consisting of CaO, BaO, and a combination thereof.

The sealant included in the first and second encapsulation layers may include an epoxy-based resin or a silicone-based resin.

In addition, the polymer included in the filler layer may include polydimethyl siloxane, but it is not limited thereto.

An example of the organic light emitting display according to one embodiment of the present invention will now be described in reference to FIG. 1. The organic light emitting display 100 includes a substrate 10, an organic light emitting diode 20 formed on one surface of the substrate 10, and an encapsulation substrate 30 arranged opposite to the substrate 10 with the organic light emitting diode 20 between the encapsulation substrate 30 and the substrate 10.

The encapsulation substrate 30 may be composed of a metal (e.g., a metal cap), a transparent glass material, or a transparent plastic material. The encapsulation substrate 30 may be more suitably formed with a transparent glass material or a transparent plastic material in a front light-emitting type organic light emitting display in which the image is expressed in a direction of the encapsulation substrate 30, or a dual-side light emitting type of organic light emitting display in which the image is expressed in both directions of the substrate 10 and the encapsulation substrate 30.

A filler layer 50 is formed on one surface of the encapsulation substrate 30 facing the substrate 10. In FIG. 1, the filler layer 50 is shown to be located in a groove formed on the encapsulation substrate 30, but it may be formed on a surface of the encapsulation substrate 30 having no groove. In addition, a first encapsulation layer 40 is formed between the substrate 10 and the encapsulation substrate 30, thereby sealing the substrate 10 and the encapsulation substrate 30 together. A second encapsulation layer 45 is formed between the encapsulation substrate 30 and the substrate 10 and adjacent to the first encapsulation layer 40.

An area where the encapsulation substrate 30 is not located on the substrate 10, a pad region is formed for inputting and outputting signals. The pad region has wires connected to electrode layers located on the organic light emitting diode 20 to input or output signals to/from the organic light emitting diode 20.

Hereinafter, the present invention is illustrated in more detail with reference to examples.

EXAMPLE 1

An organic light emitting display including a filler layer, a first encapsulation layer, and a second encapsulation layer was fabricated as shown in FIG. 1.

The filler layer included polydimethyl siloxane and a moisture absorbent of BaO, the first encapsulation layer included an epoxy-based resin (compound name or trade mark: TB3124: manufactured by ThreeBond Co., Ltd.) and CaO, and the second encapsulation layer included the epoxy-based resin and a moisture absorbent of CaO.

The amount of moisture absorbent included in the filler layer was 0.2 wt % based on the total weight of the filler layer, the amount of moisture absorbent included in the second encapsulation layer was 2 wt % based on the total weight of the second encapsulation layer, and the amount of moisture absorbent included in the second encapsulation layer was 10 parts by weight with respect to 1 part by weight of the moisture absorbent included in the filler layer. The amount of moisture absorbent included in the first encapsulation layer was 0.1 wt % based on the total weight of the first encapsulation layer.

Comparative Example 1

An organic light emitting display was fabricated to have a similar structure to that shown in FIG. 1, but it included a CaO moisture absorbent only in the first encapsulation layer. The amount of CaO moisture absorbent was 0.1 wt % based on the total weight of the first encapsulation layer.

Comparative Example 2

An organic light emitting display was fabricated with the first encapsulation layer and the second encapsulation layer as shown in FIG. 1, but it did not include a filler layer. The second encapsulation layer included a CaO moisture absorbent, and the amount of CaO moisture absorbent was 2 wt % based on the total weight of the second encapsulation layer. The amount of moisture absorbent included in the first encapsulation layer was 0.1 wt % based on the total weight of the first encapsulation layer.

The organic light emitting displays obtained from Example 1 and Comparative Examples 1 and 2 were evaluated to determine water vapor transmission rate (WVTR) and lifespan. The results are shown in the following Table 1. In Table 1, the life-spans of the organic light emitting displays were determined by measuring the duration until the luminance decreased to 97% with respect to the initial luminance (i.e., the luminance decreased by 3%).

TABLE 1

| No | Condition | Water vapor transmission rate (g/m² * day) | Life-span of organic light emitting diode (time for luminance to decrease to 97%) |
|---|---|---|---|
| Comparative Example 1 | First encapsulation layer (CaO 0.1 wt %) | about 0.5 | 3 days |
| Comparative Example 2 | First encapsulation layer (CaO 0.1 wt %) + Second encapsulation layer (CaO 2 wt %) | about $10^{-2}$ | one month |
| Example 1 | First encapsulation layer (CaO 0.1 wt %) + Second encapsulation layer (CaO 2 wt %) + filler layer (BaO 0.2 wt %) | about $10^{-3}$ | three months |

As shown in Table 1, in the case of Example 1 in which the moisture absorbent was included in the filler layer and the second encapsulation layer, there was a remarkably improved life-span characteristic along with a very low water vapor transmission rate compared to those of Comparative Example 1 having no moisture absorbent and those of Comparative Example 2 including only the second encapsulation layer.

The present invention is not limited to the embodiments illustrated with the drawings and table, but may be fabricated into various modifications and equivalent arrangements included within the spirit and scope of the appended claims by a person who is ordinarily skilled in this field. Therefore, the aforementioned embodiments should be understood to be exemplary but not limiting the present invention in any way.

What is claimed is:

1. An organic light emitting display comprising:
   a substrate;
   an organic light emitting diode on the substrate;
   an encapsulation substrate arranged opposite and substantially parallel to the substrate with the organic light emitting diode therebetween;
   a filler layer at a side of the encapsulation substrate facing the substrate;
   a first encapsulation layer located between the encapsulation substrate and the substrate and configured to seal the substrate and the encapsulation substrate together; and
   a second encapsulation layer located adjacent to the first encapsulation layer and between the encapsulation substrate and the substrate,
   wherein the filler layer and the second encapsulation layer each comprise a moisture absorbent.

2. The organic light emitting display of claim 1, wherein the moisture absorbent included in the filler layer and the moisture absorbent included in the second encapsulation layer have a relationship represented by the following Equation 1:

$$B-A>0 \qquad \text{Equation 1}$$

where B is an amount of the moisture absorbent included in the second encapsulation layer, and
A is an amount of the moisture absorbent included in the filler layer.

3. The organic light emitting display of claim 2, wherein the amount of moisture absorbent included in the second encapsulation layer is between about 1 to 30 wt % of the second encapsulation layer.

4. The organic light emitting display of claim 2, wherein the amount of moisture absorbent included in the filler layer is between about 0.1 to 10 wt % of the filler layer.

5. The organic light emitting display of claim 1, wherein the moisture absorbent is selected from the group consisting of CaO, BaO, and a combination thereof.

6. The organic light emitting display of claim 1, wherein the first encapsulation layer comprises a moisture absorbent.

7. The organic light emitting display of claim 6, wherein the moisture absorbent included in the first encapsulation layer has a relationship represented by the following Equation 2:

$$A-C>0 \qquad \text{Equation 2}$$

where C is an amount of the moisture absorbent included in the first encapsulation layer, and
A is an amount of the moisture absorbent included in the filler layer.

8. The organic light emitting display of claim 7, wherein the amount of the moisture absorbent included in the first encapsulation layer is between about 0 to 1 wt % of the first encapsulation layer.

9. The organic light emitting display of claim 1, wherein the filler layer comprises an epoxy-based resin or a silicone-based resin.

10. The organic light emitting display of claim 1, wherein the first encapsulation layer comprises an epoxy-based resin.

11. The organic light emitting display of claim 1, wherein the second encapsulation layer comprises an epoxy-based resin or a silicone-based resin.

12. The organic light emitting display of claim 1, wherein the second encapsulation layer is arranged to be closer to the organic light emitting diode than the first encapsulation layer.

13. The organic light emitting display of claim 12, wherein the filler layer is arranged on a side of the second encapsulation layer opposite a side on which the first encapsulation layer is arranged.

14. The organic light emitting display of claim 1, wherein at least a portion of the filler layer faces the organic light emitting diode.

15. A method of sealing an organic light emitting display comprising a substrate, an organic light emitting diode on the substrate, and an encapsulation substrate arranged opposite and substantially parallel to the substrate with the organic light emitting diode therebetween, the method comprising:

sealing the substrate and the encapsulation substrate together using a first encapsulation layer located between the encapsulation substrate and the substrate; and placing a filler layer at a side of the encapsulation substrate facing the substrate and a second encapsulation layer located adjacent to the first encapsulation layer and between the encapsulation substrate and the substrate, wherein the filler layer and the second encapsulation layer each comprise a moisture absorbent.

16. The method of claim 15, wherein the first encapsulation layer is around the periphery of the substrates.

17. The method of claim 15, wherein the second encapsulation layer is around the periphery of the substrates.

18. The method of claim 15, wherein the first encapsulation layer comprises a moisture absorbent.

* * * * *